(12) United States Patent
Nagata et al.

(10) Patent No.: US 10,705,161 B2
(45) Date of Patent: Jul. 7, 2020

(54) MAGNETIC FIELD DETECTION DEVICE

(71) Applicant: TDK CORPORATION, Tokyo (JP)

(72) Inventors: Masaki Nagata, Tokyo (JP); Kazuya Watanabe, Tokyo (JP); Keisuke Uchida, Tokyo (JP); Kohei Honma, Tokyo (JP); Hiraku Hirabayashi, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/403,879

(22) Filed: May 6, 2019

(65) Prior Publication Data
US 2019/0257895 A1 Aug. 22, 2019

Related U.S. Application Data

(63) Continuation of application No. 15/714,093, filed on Sep. 25, 2017, now Pat. No. 10,330,747.

(30) Foreign Application Priority Data

Dec. 15, 2016 (JP) .................. 2016-243072

(51) Int. Cl.
*G01R 33/09* (2006.01)
*G01R 33/02* (2006.01)

(52) U.S. Cl.
CPC ....... *G01R 33/091* (2013.01); *G01R 33/0206* (2013.01); *G01R 33/093* (2013.01)

(58) Field of Classification Search
CPC ........ G01N 27/72; G01N 27/82; G01R 33/00; G01R 33/0035; G01R 33/0047; G01R 33/0322; G01R 33/0327; G01R 33/10; G01R 33/1284
See application file for complete search history.

(56) References Cited

U.S. PATENT DOCUMENTS

| 6,144,524 A * | 11/2000 | Haratani | ............... B82Y 10/00 257/E43.004 |
| 8,378,674 B2 | 2/2013 | Furukawa et al. | |
| 2003/0042902 A1* | 3/2003 | Kobayashi | ............ B82Y 25/00 324/252 |

FOREIGN PATENT DOCUMENTS

| JP | H11-087804 A | 3/1999 |
| JP | 2004-354181 A | 12/2004 |
| JP | 2005-257605 A | 9/2005 |
| JP | 2006-300540 A | 11/2006 |
| WO | 2008/146809 A1 | 12/2008 |

* cited by examiner

*Primary Examiner* — Tung X Nguyen
(74) *Attorney, Agent, or Firm* — Oliff PLC

(57) ABSTRACT

A magnetic field detection device includes a first soft magnetic body, a second soft magnetic body, and a magnetism detection element. The first soft magnetic body extends to have a first length in a first direction, and has a first width, smaller than the first length, in a second direction. The second direction is substantially orthogonal to the first direction. The second soft magnetic body is disposed to be spaced apart from and face the first soft magnetic body in the first direction, extends to have a second length in the first direction, and has a second width, smaller than the second length, in the second direction. The magnetism detection element is disposed, in the first direction, between the first and second soft magnetic bodies, and extends to have a third length in the first direction and a third width, larger than the third length, in the second direction.

14 Claims, 12 Drawing Sheets

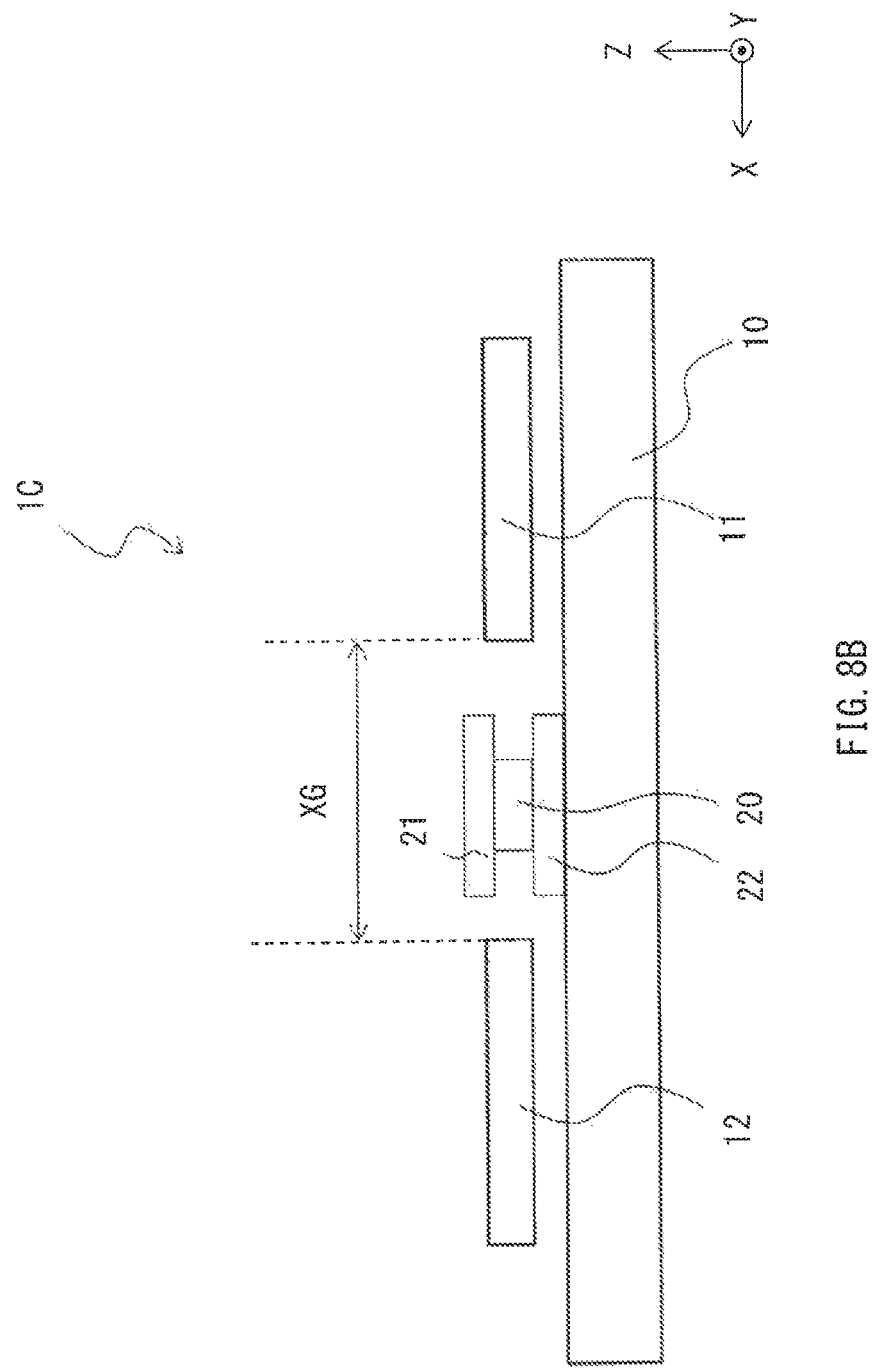

MAGNETIC FIELD DETECTION DEVICE

CROSS REFERENCE TO RELATED APPLICATIONS

This application is a continuation of U.S. patent application Ser. No. 15/714,093, filed Sep. 25, 2017, now U.S. Pat. No. 10,330,747 which claims the benefit of Japanese Priority Patent Application JP2016-243072 filed on Dec. 15, 2016, the entire contents of which are incorporated herein by reference.

BACKGROUND

The disclosure relates to a magnetic field detection device that detects a magnetic field using a magnetism detection element.

As a magnetic field detection device that detects an external magnetic field, a magnetic field detection device utilizing a Hall element or a magneto-resistive effect element has been known. For example, reference is made to International Publication No. WO 2008/146809.

SUMMARY

Incidentally, in recent years, it has been requested to improve a capability of detecting a magnetic field.

It is desirable to provide a magnetic field detection device having a more superior magnetic field detection capability.

A magnetic field detection device according to an embodiment of the disclosure includes a first soft magnetic body, a second soft magnetic body, and a magnetism detection element. The first soft magnetic body extends to have a first length in a first direction, and has a first width in a second direction, that is smaller than the first length. The second direction is substantially orthogonal to the first direction. The second soft magnetic body is disposed to be spaced apart from and face the first soft magnetic body in the first direction, and extends to have a second length in the first direction. The second soft magnetic body has a second width in the second direction. The second width is smaller than the second length. The magnetism detection element is disposed, in the first direction, between the first soft magnetic body and the second soft magnetic body. The magnetism detection element extends to have a third length in the first direction and to have a third width in the second direction. The third width is larger than the third length.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the disclosure.

FIG. 8B is a schematic view of a magnetic field detection device according to a second modification example.

DETAILED DESCRIPTION

Some embodiments of the disclosure are described below in detail with reference to the accompanying drawings. It is to be noted that the description is given in the following order.

1. First Embodiment

An example of a magnetic field detection device including a pair of soft magnetic layers and a magnetism detection element disposed therebetween.

2. Second Embodiment

An example of a magnetic field detection device including, on a substrate, a plurality of magnetism detection elements each interposed between a pair of soft magnetic layers.

3. Experimental Examples

4. Other Modification Examples

1. First Embodiment

Configuration of Magnetic Field Detection Device 1

Figure 1A:
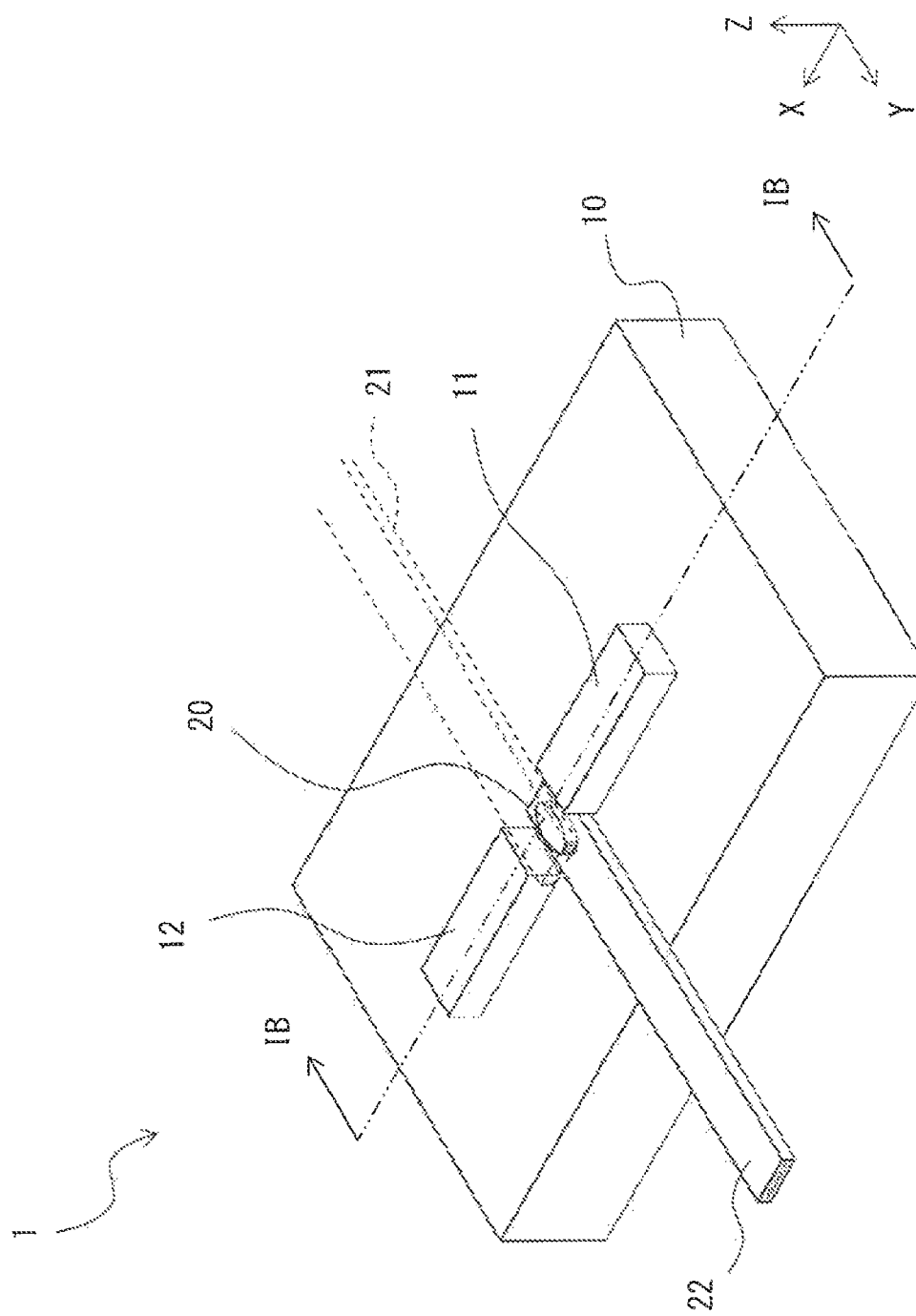
FIG. 1A is a schematic perspective view of an overall configuration of a magnetic field detection device according to a first embodiment of the disclosure.
Figure 1B:
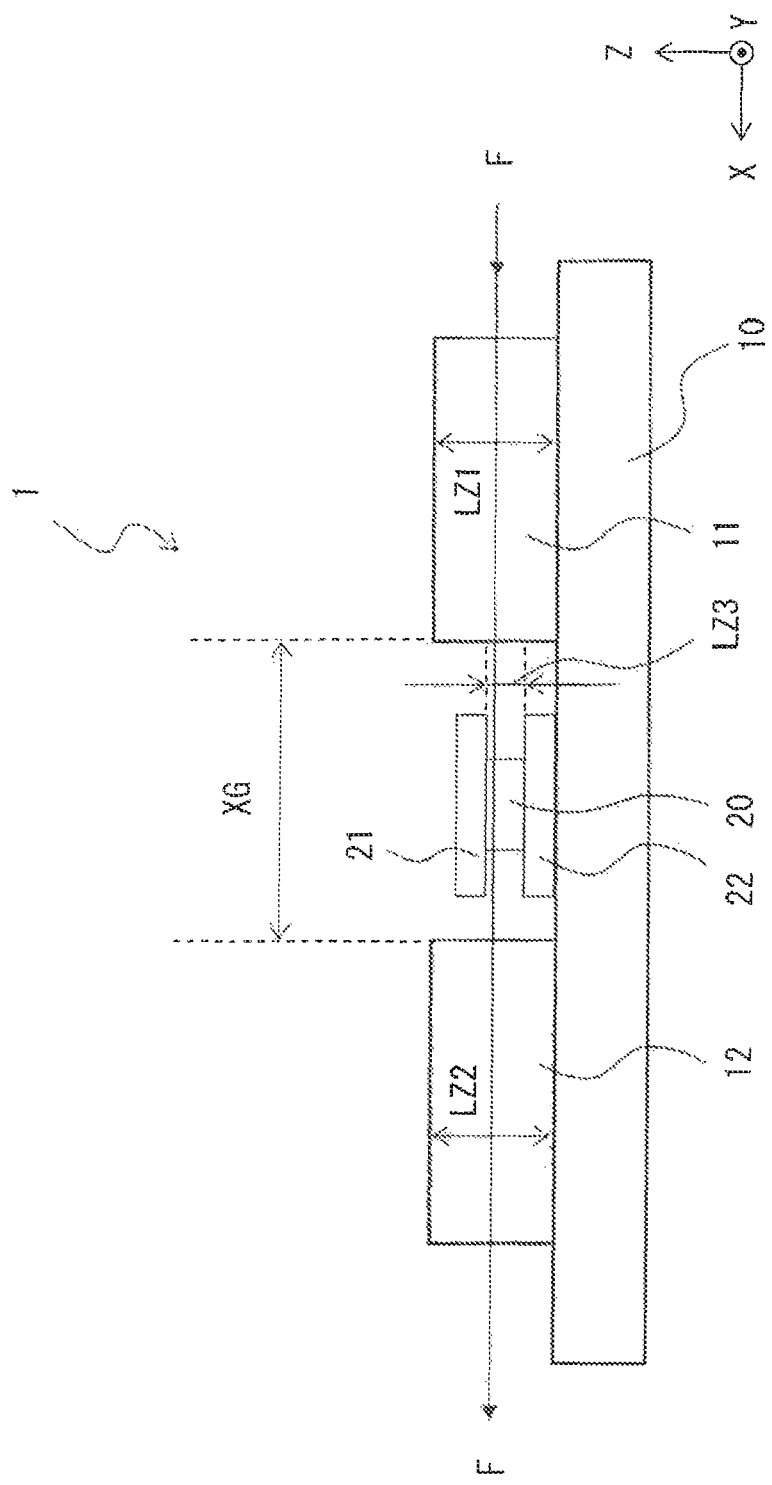
FIG. 1B is a cross-sectional view of a cross-sectional configuration of the magnetic field detection device illustrated in FIG. 1A.
Figure 1C:
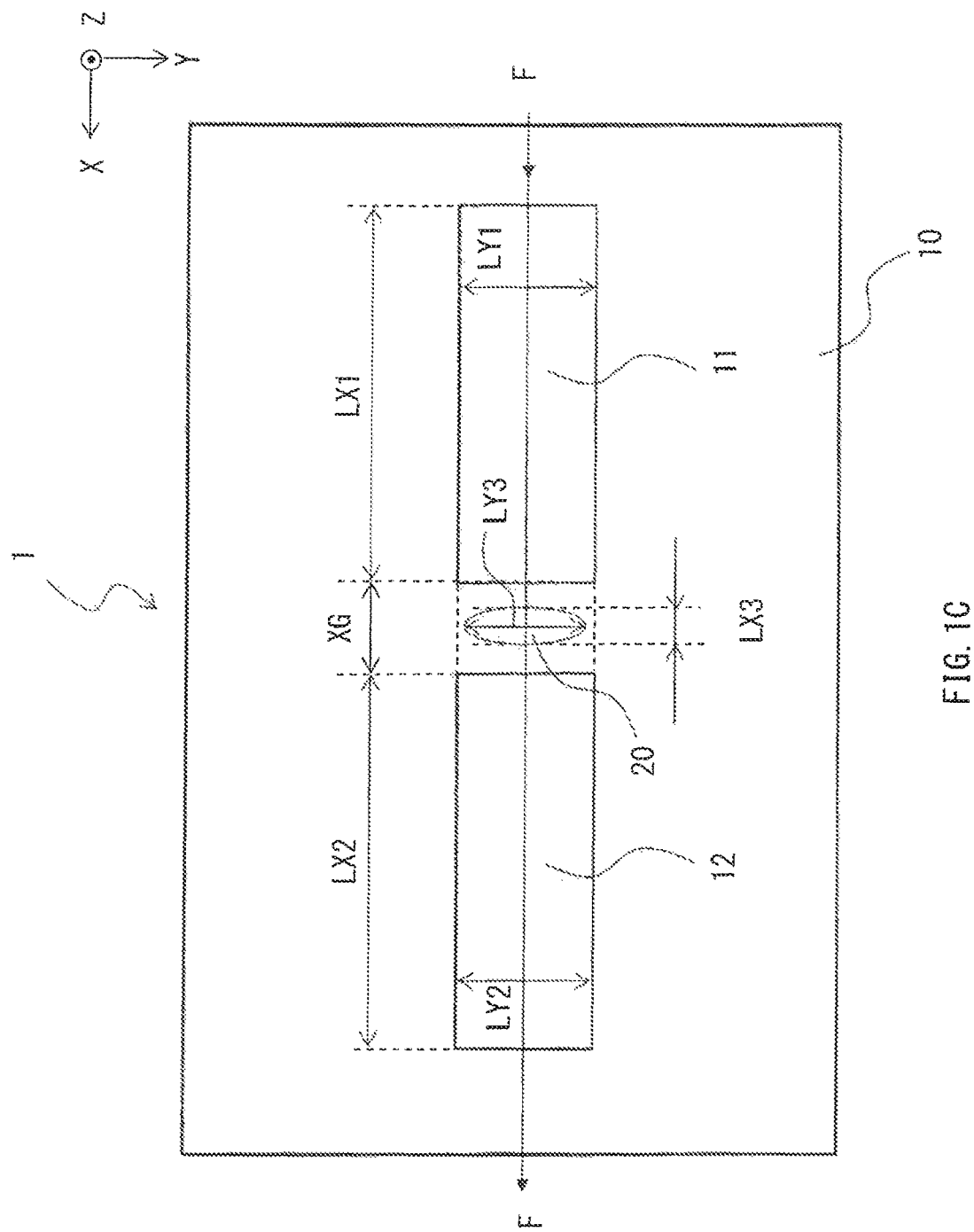
FIG. 1C is a plan view of a planar configuration of the magnetic field detection device illustrated in FIG. 1A.
Figure 2:
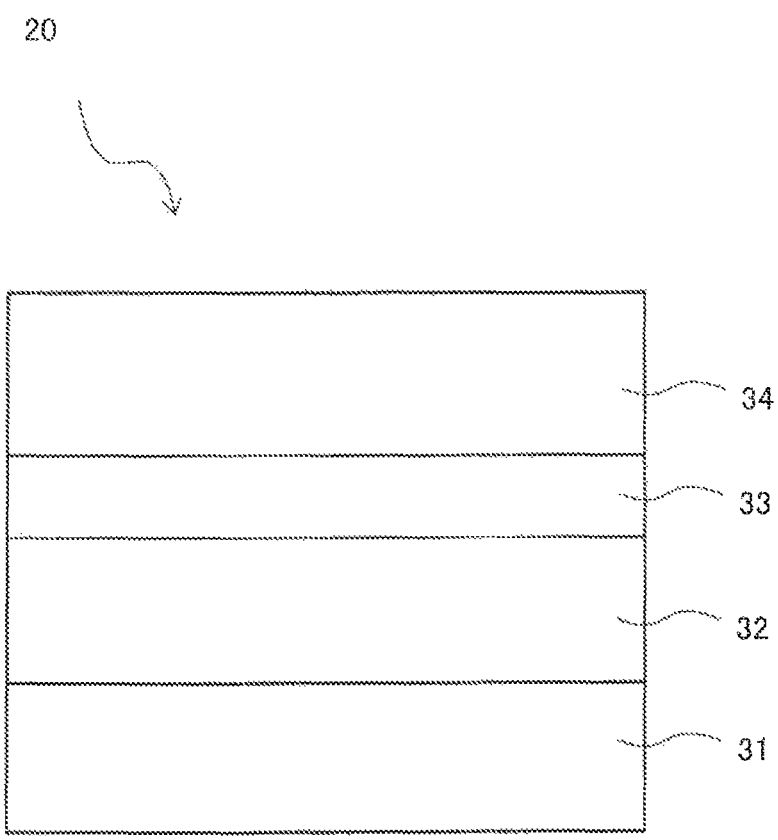
FIG. 2 is an enlarged cross-sectional view of a cross-sectional configuration of a magnetism detection element illustrated in FIG. 1A.

First, a description is given, with reference to FIGS. 1A, 1B, and 2, for example, of a configuration example of a magnetic field detection device 1 according to a first embodiment of the disclosure. FIG. 1A is a perspective view of an overall configuration of the magnetic field detection device 1. FIG. 1B illustrates a cross-sectional configuration example of the magnetic field detection device 1 as viewed in an arrow direction along a line IB-IB illustrated in FIG. 1A. Further, FIG. 1C is a plan view of an overall configuration example of the magnetic field detection device 1. FIG. 2 illustrates a cross-sectional configuration example of a magnetism detection element 20 illustrated in FIGS. 1A and 1B.

The magnetic field detection device 1 may be a device that detects presence or absence, direction, and intensity of an external magnetic field reaching itself, and may be mounted on an electronic compass, for example. Here, a direction of a magnetic field to be detected such as the external magnetic field may be, for example, substantially coincident with an X-axis direction. The magnetic field detection device 1 includes, on a base 10 extending both in the X-axis direction and in a Y-axis direction, a pair of soft magnetic layers 11 and 12 and a magnetism detection element 20. The pair of soft magnetic layers 11 and 12 are disposed to face each other in the X-axis direction, for example. The magnetism detection element 20 is provided between the soft magnetic layers 11 and 12 in the X-axis direction. The magnetic field detection device 1 may further include leads 21 and 22 that supply a sense current to the magnetism detection element 20. It is to be noted that FIGS. 1C and 2 omit illustration of the leads 21 and 22. It is to be noted that the X-axis direction is a specific but non-limiting example corresponding to a "first direction" of the disclosure, and the Y-axis direction is a specific but non-limiting example corresponding to a "second direction" of the disclosure. Further, in the present specification, a Z-axis direction that is a direction orthogonal to both of the X-axis direction and the Y-axis direction is also referred to as a thickness direction.

Soft Magnetic Layers 11 and 12

The soft magnetic layers 11 and 12 may be each substantially a cuboid member having the X-axis direction as a longitudinal direction. The soft magnetic layers 11 and 12 may be each made of, for example, a soft magnetic metal material having high saturation magnetic flux density, such as a nickel-iron alloy (NiFe). It is to be noted that constituent materials of the soft magnetic layers 11 and 12 may be substantially the same as each other, or may be different from each other.

As illustrated in FIG. 1C, the planar shape in an X-Y plane of the soft magnetic layer 11 may be a rectangular shape, for example. In this case, the soft magnetic layer 11 has a first length LX1 (hereinafter, simply referred to as length LX1) along the X-axis direction, and has a first width LY1 (hereinafter, simply referred to as width LY1) along the Y-axis direction. Further, as illustrated in FIG. 1B, the soft magnetic layer 11 has a first thickness LZ1 (hereinafter, simply referred to as thickness LZ1) along the Z-axis direction. The length LX1 may be, for example, equal to or smaller than 100 μm, and may be preferably about 12 μm. The width LY1 may be, for example, equal to or smaller than 100 μm, and may be preferably about 4 μm. Further, the thickness LZ1 may be, for example, equal to or smaller than 10 μm, and may be preferably a size smaller than those of both of the length LX1 and the width LY1.

As illustrated in FIG. 1C, the planar shape in the X-Y plane of the soft magnetic layer 12 may be a rectangular shape, for example, similarly to the soft magnetic layer 11. In this case, the soft magnetic layer 12 has a second length LX2 (hereinafter, simply referred to as length LX2) along the X-axis direction, and has a second width LY2 (hereinafter, simply referred to as width LY2) along the Y-axis direction. Further, as illustrated in FIG. 1B, the soft magnetic layer 12 has a second thickness LZ2 (hereinafter, simply referred to as thickness LZ2) along the Z-axis direction. The length LX2 may be, for example, equal to or smaller than 100 μm, and may be preferably about 12 μm. The width LY2 may be, for example, equal to or smaller than 100 μm, and may be preferably about 4 μm. Further, the thickness LZ2 may be, for example, equal to or smaller than 10 μm, and may be preferably a size smaller than those of both of the length LX2 and the width LY2.

Magnetism Detection Element 20

As the magnetism detection element 20, for example, a magneto-resistive effect (MR) element may be used that exhibits a resistance change depending on a direction and intensity of the external magnetic field. As illustrated in FIG. 1C, the planar shape in the X-Y plane of the magnetism detection element 20 may be an elliptical shape; for example. In this case, the magnetism detection element 20 has a third length LX3 (hereinafter, simply referred to as length LX3) along the X-axis direction, and has a third width LY3 (hereinafter, simply referred to as width LY3) along the Y-axis direction. Further, as illustrated in FIG. 1B, the magnetism detection element 20 has a third thickness LZ3 (hereinafter, simply referred to as thickness LZ3) along the Z-axis direction. The planar shape of the magnetism detection element 20 is not limited to the elliptical shape, and may be, for example, a rectangular shape, an oval shape, or a rhomboidal shape.

As illustrated in FIG. 2, for example, the magnetism detection element 20 may be a CPP (current perpendicular to plane) MR element having a spin-valve structure in which a plurality of functional films including a magnetic layer are stacked; a sense current flows in a layer-stacking direction in which the functional films are stacked inside the magnetism detection element 20. More specifically, as illustrated in FIG. 2, the magnetism detection element 20 may include a stacked body in which an antiferromagnetic layer 31, a magnetization pinned layer 32, an intermediate layer 33, and a magnetization free layer 34 are stacked in order. The magnetization pinned layer 32 has magnetization pinned in a certain direction. The intermediate layer 33 does not exhibit a specific magnetization direction. The magnetization free layer 34 has magnetization varying in accordance with the external magnetic field. It is to be noted that the antiferromagnetic layer 31, the magnetization pinned layer 32, the intermediate layer 33, and the magnetization free layer 34 may each have a single-layer structure or a multi-layer structure configured by a plurality of layers. In such an MR element, the resistance change may occur in accordance with a change in the magnetic flux along a film plane (X-Y plane) orthogonal to the layer-stacking direction (e.g., Z-axis direction).

The antiferromagnetic layer 31 may be made of an antiferromagnetic material such as a platinum-manganese alloy (PtMn) and an iridium-manganese alloy (IrMn). The antiferromagnetic layer 31 is in a state, for example, in which a spin magnetic moment in a direction substantially the same as an orientation of the magnetization of the adjacent magnetization pinned layer 32 and a spin magnetic moment in a direction directly opposite thereto completely cancel each other, and serves to fix the orientation of the magnetization pinned layer 32 into a certain direction.

The magnetization pinned layer 32 may be made of, for example, a ferromagnetic material such as cobalt (Co), a cobalt-iron alloy (CoFe), and a cobalt-iron-boron alloy (CoFeB). In the present embodiment, the magnetization direction of the magnetization pinned layer 32 may be desirably coincident with the X-axis direction.

In a case where the magnetism detection element 20 is a magnetic tunnel junction (MTJ) element, the intermediate layer 33 may be a non-magnetic tunnel barrier layer made of a magnesium oxide (MgO), for example, and may have a thickness that is thin to the extent that a tunnel current based on quantum mechanics is able to pass therethrough. The tunnel barrier layer made of MgO may be obtained by a process such as a process of oxidizing a thin film made of magnesium (Mg) and a reactive sputtering process in which sputtering of magnesium is performed under an oxygen atmosphere, besides a sputtering process that uses a target made of MgO, for example. It is also possible to configure the intermediate layer 33 with use of an oxide or a nitride of each of aluminum (Al), tantalum (Ta), and hafnium (Hf), besides MgO. In a case where the magnetism detection element 20 is a giant magnetoresistive (GMR) element, for example, the intermediate layer 33 may be made of a non-magnetic highly-electroconductive material such as copper (Cu), ruthenium (Ru) and gold (Au).

The magnetization free layer 34 may be a soft ferromagnetic layer, and may have, for example, a magnetization easy axis substantially orthogonal to the orientation of the magnetization of the magnetization pinned layer 32. The magnetization free layer 34 may be made of a material such as a cobalt-iron alloy (CoFe), a nickel-iron alloy (NiFe), and a cobalt-iron-boron alloy (CoFeB). In the present embodiment, the direction of the magnetization easy axis of the magnetization free layer 34 may be desirably coincident with the Y-axis. When the length LX3 is smaller than the width LY3 in the magnetism detection element 20, it becomes easy to allow the direction of the magnetization easy axis of the magnetization free layer 34 to be coincident with the Y-axis direction.

Leads 21 and 22

The lead 21 extends on the X-Y plane to be brought into contact with a part (e.g., a top surface of the magnetization free layer 34) of the magnetism detection element 20. The lead 22 extends on the X-Y plane to be brought into contact with any other part (e.g., an undersurface of the antiferromagnetic layer 31) of the magnetism detection element 20. The leads 21 and 22 may be made of, for example, a highly-electroconductive non-magnetic material such as copper and aluminum (Al).

Here, the width LY3 of the magnetism detection element 20 may be substantially the same as one or both of the width LY1 of the soft magnetic layer 11 and the width LY2 of the soft magnetic layer 12, or may be substantially narrower than one or both of the width LY1 and the width LY2. In particular, the width LY3 may preferably have a size substantially equal to or smaller than both of the width LY1 and the width LY2. In other words, it is desirable to satisfy one or both of the following conditional expressions (1) and (2).

$$LY3 \leq LY1 \tag{1}$$

$$LY3 \leq LY2 \tag{2}$$

In the present embodiment, the width LY1 and the width LY2 may be desirably substantially the same as each other. The width LY1 and the width LY2 may be each about 4 μm, for example.

In the present embodiment, a spacing XG between the soft magnetic layers 11 and 12 may be desirably narrower than any of the widths LY1 to LY3 (see FIG. 1C). The spacing XG may be, for example, about 0.4 μm.

In the present embodiment, the length LX1 may be preferably larger than the width LY1 in the soft magnetic layer 11, and the length LX2 may be preferably larger than the width LY2 in the soft magnetic layer 12. Further, the length LX3 may be preferably smaller than the width LY3 in the magnetism detection element 20. Here, when each of the width LY1 and the width LY2 ranges, for example, 10 μm to 100 μm, it is desirable to satisfy the following conditional expressions (3) and (4). The length LX1 may be substantially the same as the length LX2.

$$3 \leq LX1/LY1 \leq 20 \tag{3}$$

$$3 \leq LX2/LY2 \leq 20 \tag{4}$$

In the present embodiment, as illustrated in FIG. 1C, the thickness LZ3 of the magnetism detection element 20 may be preferably equal to or smaller than one or both of the thickness LZ1 and the thickness LZ2.

In the present embodiment, the magnetism detection element 20 may be preferably disposed on an extension of the soft magnetic layer 11 in the X-axis direction, or may be preferably disposed on an extension of the soft magnetic layer 12 in the X-axis direction. Alternatively, the magnetism detection element 20 may be disposed on the extensions of both of the soft magnetic layers 11 and 12 in the X-axis direction.

Signal Detection Circuit

Figure 3:
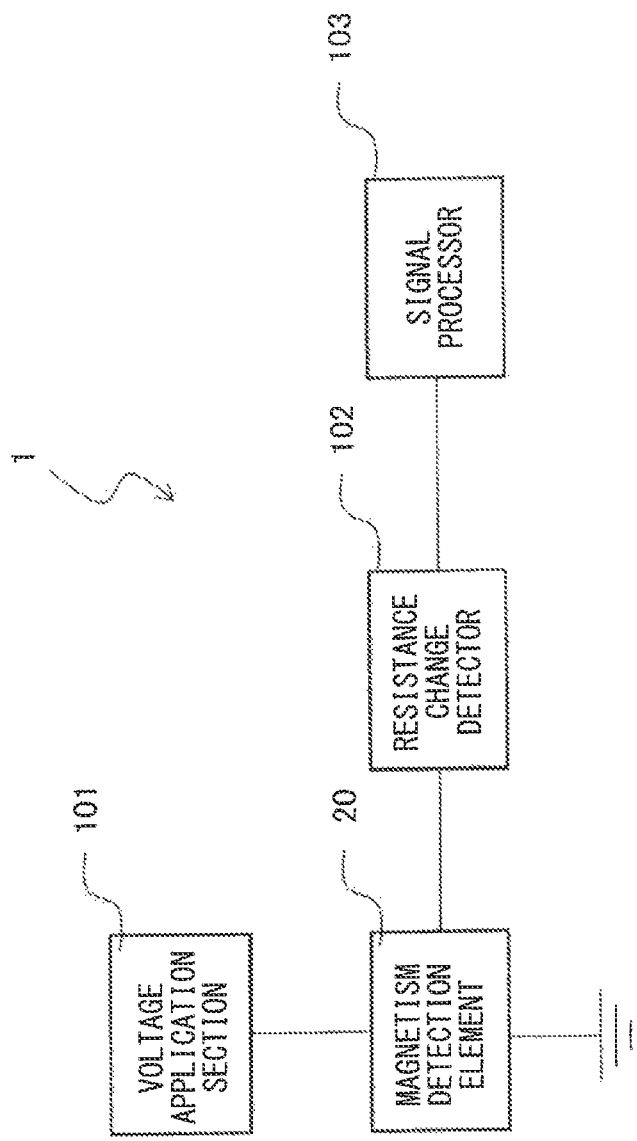
FIG. 3 is a circuit diagram illustrating an example of a signal detection circuit to be mounted on the magnetic field detection device illustrated in FIG. 1A.

The magnetic field detection device 1 may include, for example, a signal detection circuit illustrated in FIG. 3. The signal detection circuit may include, for example, a voltage application section 101, the magnetism detection element 20, a resistance change detector 102, and a signal processor 103. The voltage application section 101 and the resistance change detector 102 may be coupled to the magnetism detection element 20. The signal processor 103 may be coupled to the resistance change detector 102.

Workings and Effects of Magnetic Field Detection Device 1

In the magnetic field detection device 1, an output in accordance with the external magnetic field that reaches the magnetic field detection device 1 is obtained by the above-described signal detection circuit. More specifically, in the above-described signal detection circuit, the voltage application section 101 applies a predetermined voltage between the leads 21 and 22 to thereby cause a sense current to flow that corresponds to an electric resistance of the magnetism detection element 20 at that time. The electric resistance of the magnetism detection element 20 varies depending on a magnetization state of the magnetism detection element 20, i.e., depending on the orientation of the magnetization of the magnetization free layer 34 with respect to the orientation of the magnetization of the magnetization pinned layer 32. The sense current flowing through the magnetism detection element 20 is detected by the resistance change detector 102, and the resistance change detector 102 outputs, to the signal processor 103, a signal based on the electric resistance of the magnetism detection element 20 detected by the resistance change detector 102. Further, a signal generated in the signal processor 103 on the basis of the output from the resistance change detector 102 is outputted to the outside. This makes it possible to obtain, from the signal detection circuit, an output in accordance with the external magnetic field that reaches the magnetic field detection device 1.

In the magnetic field detection device 1 according to the present embodiment, the soft magnetic layers 11 and 12 each having the X-axis direction as the longitudinal direction are disposed side by side and spaced apart from each other in the X-axis direction. Further, the magnetism detection element 20 having, as the longitudinal direction, the Y-axis direction orthogonal to the X-axis direction is disposed between the soft magnetic layers 11 and 12. This allows for both the soft magnetic layers 11 and 12 to behave as a magnetic yoke. As a result, when the external magnetic field along the X-axis direction is applied to the magnetic field detection device 1, for example, an external magnetic field component F (see FIGS. 1B and 1C), along the X-axis direction, that reaches the magnetism detection element 20 is enhanced by the soft magnetic layers 11 and 12. Thus, it is possible for the magnetic field detection device 1 to exhibit a high magnetic field detection capability. In the magnetism detection element 20, coincidence of the magnetization direction of the magnetization pinned layer 32 with the X-axis direction and coincidence of the magnetization easy axis direction of the magnetization free layer 34 with the Y-axis direction allow the soft magnetic layers 11 and 12 to be disposed along a sensing direction. Thus, it becomes possible for the magnetic field detection device 1 to exhibit a higher magnetic field detection capability.

2. Second Embodiment

Figure 4:
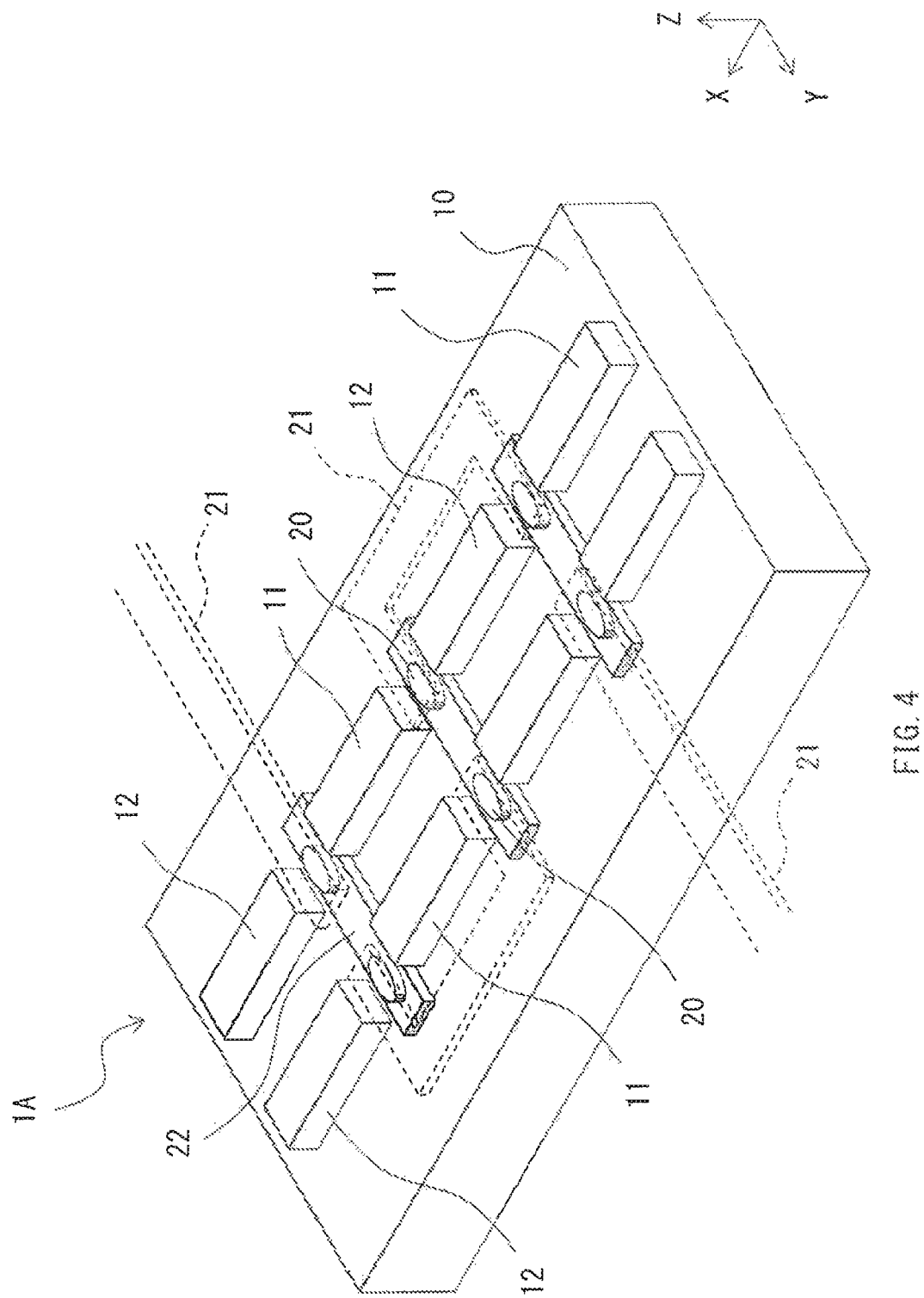
FIG. 4 is a schematic perspective view of an overall configuration of a magnetic field detection device according to a second embodiment of the disclosure.

A description is given next, with reference to FIG. 4, of a configuration of a magnetic field detection device 1A according to a second embodiment of the disclosure. FIG. 4 is a perspective view of an overall configuration example of the magnetic field detection device 1A.

The magnetic field detection device 1A according to the present embodiment includes, on the base 10, a plurality of magnetism detection elements 20 and a plurality of soft magnetic layers 11 and 12. Accordingly, a plurality of leads 21 and 22 are also provided. Except these points, the magnetic field detection device 1A has substantially similar configurations to those of the magnetic field detection device 1 according to the foregoing first embodiment.

More specifically, as illustrated in FIG. 4, on the base 10, the soft magnetic layers 11 and 12 arranged alternately with an interspace therebetween in the X-axis direction are provided in two columns to be adjacent to each other in the Y-axis direction. Further, one magnetism detection element 20 is disposed in each interspace between the soft magnetic layers 11 and 12 in the X-axis direction. Although FIG. 4 exemplifies six magnetism detection elements 20 arranged in two rows and three columns, and a total of eight soft magnetic layers 11 and 12 disposed to interpose the six magnetism detection elements 20 therebetween, the number and the form of the arrangement of the magnetism detection elements 20 and the soft magnetic layers 11 and 12 are not limited to those illustrated in FIG. 4. However, all of the plurality of magnetism detection elements 20 may be preferably provided in identical level. The plurality of magnetism detection elements 20 may be coupled serially as a whole through the plurality of leads 21 and 22, for example. This configuration makes it possible to increase the entire output in the magnetic field detection device 1A, as compared with that of the magnetic field detection device 1.

3. Experimental Examples

3.1 Experimental Examples 1-1 to 1-6

Next, an external magnetic field of 0.1 mT was applied to the magnetic field detection device 1 illustrated in FIG. 1A in a +X direction, and a magnetic field intensity on the line IB-IB illustrated in FIG. 1A was determined to calculate an enhancement rate of the magnetic field detection device 1. The enhancement rate [%] is a ratio of the magnetic field intensity of the magnetism detection element 20 on the line IB-IB in FIG. 1A to the intensity of the applied external magnetic field. Here, the widths LY1 and LY2 were both set at 10 μm in each of Experimental Examples 1-1 to 1-6. Meanwhile, the lengths LX1 and LX2 were both set at 10 μm in Experimental Example 1-1, 30 μm in Experimental Example 1-2, 100 μm in Experimental Example 1-3, 200 μm in Experimental Example 1-4, 400 μm in Experimental Example 1-5, and 1,400 μm in Experimental Example 1-6. In other words, aspect ratios LX1/LY1 and LX2/LY2 (hereinafter, referred to collectively as the aspect ratio LX/LY) was set at 1 (one) in Experimental Example 1-1, 3 in Experimental Example 1-2, 10 in Experimental Example 1-3, 20 in Experimental Example 1-4, 40 in Experimental Example 1-5, and 140 in Experimental Example 1-6. The spacing XG was set at 5 μm in all of the Experimental Examples. The thicknesses LZ1 and LZ2 were both set at 1 (one) μm in all of the Experimental Examples.

Figure 5A:
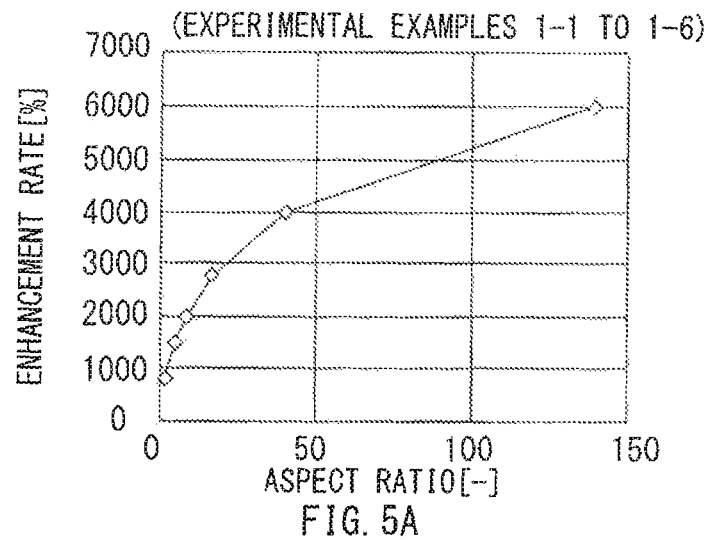
FIG. 5A is a characteristic diagram illustrating a relationship between an aspect ratio and an enhancement rate in a magnetic field detection device of Experimental Examples 1-1 to 1-6.

Simulation results of Experimental Examples 1-1 to 1-6 are illustrated in FIG. 5A. In FIG. 5A, the horizontal axis indicates the aspect ratio LX/LY [–], and the vertical axis indicates the enhancement rate [%]. As illustrated in FIG. 5A, it was found that the increase in the aspect ratio caused the enhancement rate to be increased in a manner of exponential function.

Figure 5B:
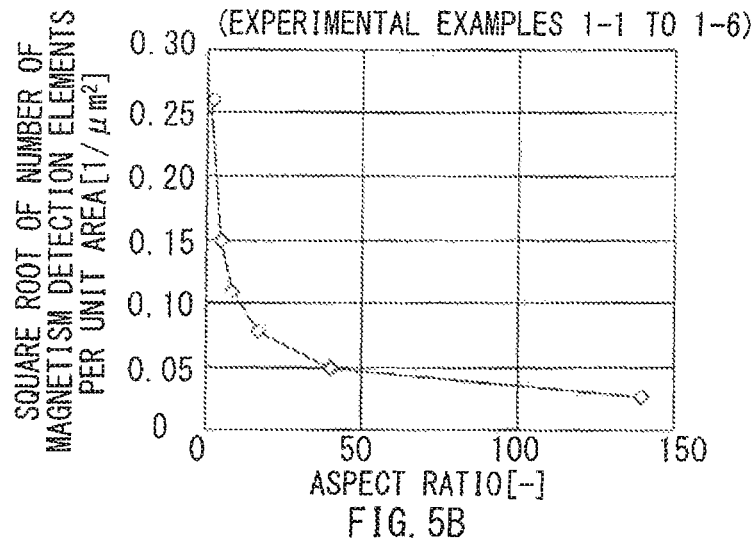
FIG. 5B is a characteristic diagram illustrating a relationship between the aspect ratio and the number of magnetism detection elements per unit area in the magnetic field detection device of Experimental Examples 1-1 to 1-6.

On the other hand, the increase in the aspect ratio causes decrease in a region on the base 10 where the magnetism detection elements 20 are mountable. FIG. 5B illustrates a relationship between the aspect ratio LX/LY [–] and the number of the magnetism detection elements 20 mountable per unit area on the base 10 in Experimental Examples 1-1 to 1-6. In FIG. 5B, the horizontal axis indicates the aspect ratio LX/LY [–], and the vertical axis indicates a square root of the number of the magnetism detection elements mountable per unit area [1/μm$^2$]. As illustrated in FIG. 5B, it was found that the increase in the aspect ratio caused the square root of the number of the magnetism detection elements mountable per unit area to be decreased in a manner of exponential function.

Resolution that represents a capability of the magnetism detection element is determined by the following expression (5).

Resolution [$T$]=Noise Voltage[$V$]/Magnetic Sensitivity[$V/T$]     (5)

Here, the noise voltage is proportional to a square root of an area occupied by the magnetism detection elements, whereas the magnetic sensitivity is proportional to the enhancement rate. Thus, in a case of considering an advantage of disposing, on the base, the soft magnetic layers together with the magnetism detection elements, it is desirable to taking account of, as a judging material, an exponent FOM (factor of merits) defined as in the expression (6) below. The exponent FOM denotes an advantage of disposing the soft magnetic layers together with the magnetism detection elements. The merit is determined by a relationship between the enhancement rate varied by the presence of the soft magnetic layers and a numerical value that indicates how many magnetism detection elements are able to be disposed per unit area on the base, i.e., the number of the magnetism detection elements mountable per unit area.

$$(FOM) = (\text{Enhancement Rate}) * (\text{Number of Magnetism Detection Elements Mountable Per Unit Area})^{0.5} \quad (6)$$

Figure 5C:
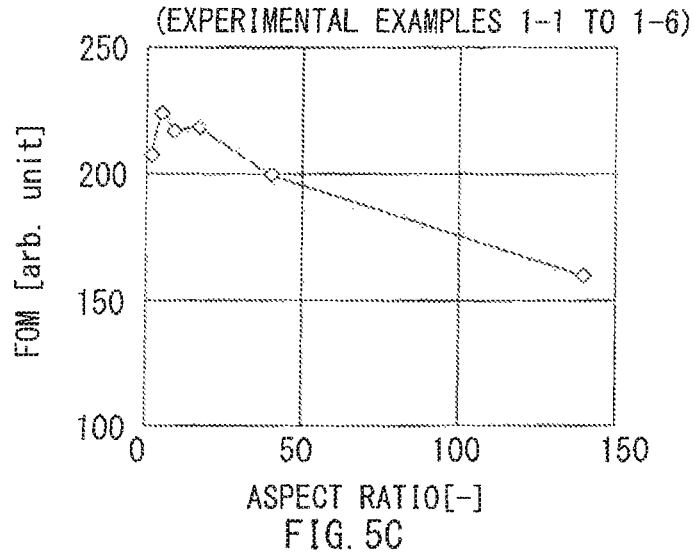
FIG. 5C is a characteristic diagram illustrating a relationship between the aspect ratio and an exponent FOM in the magnetic field detection device of Experimental Examples 1-1 to 1-6.

The relationship between the exponent FOM defined as above and the aspect ratio is illustrated in FIG. 5C. In FIG. 5C, the horizontal axis indicates the aspect ratio LX/LY [–], and the vertical axis indicates the exponent FOM [arb. unit]. As illustrated in FIG. 5C, it was found that high exponent FOM was obtained in a case of the aspect ratio ranging from 3 to 20. In other words, it was found that the magnetic field detection device 1 allowed for obtainment of more favorable resolution in a case of the aspect ratio ranging from 3 to 20.

3.2 Experimental Examples 2-1 to 2-6

Next, evaluations similar to those in Experimental Examples 1-1 to 1-6 were performed under conditions similar to those in Experimental Examples 1-1 to 1-6 except that the spacing XG was set at 10 μm. The results are illustrated in each of FIGS. 6A to 6C. It is to be noted that FIGS. 6A to 6C illustrate results that correspond, respectively, to those of FIGS. 5A to 5C.

Figure 6A:
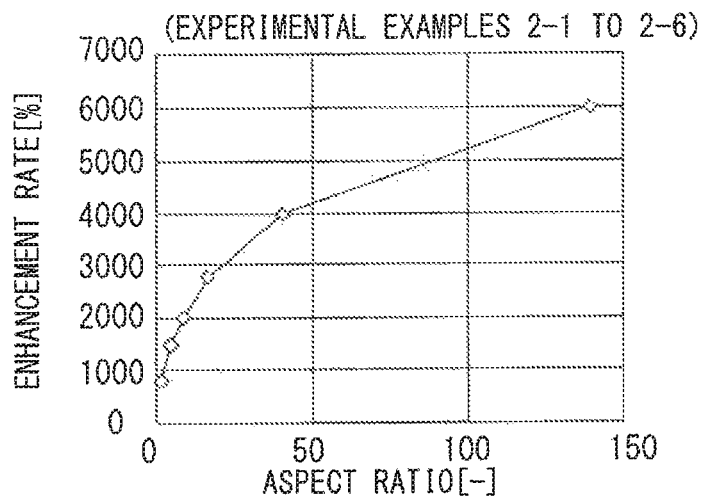
FIG. 6A is a characteristic diagram illustrating a relationship between an aspect ratio and an enhancement rate in a magnetic field detection device of Experimental Examples 2-1 to 2-6.
Figure 6B:
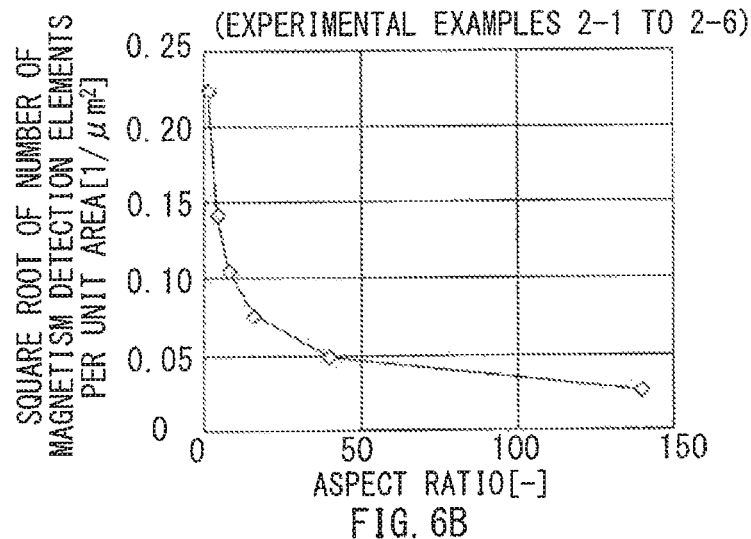
FIG. 6B is a characteristic diagram illustrating a relationship between the aspect ratio and the number of magnetism detection elements per unit area in the magnetic field detection device of Experimental Examples 2-1 to 2-6.
Figure 6C:
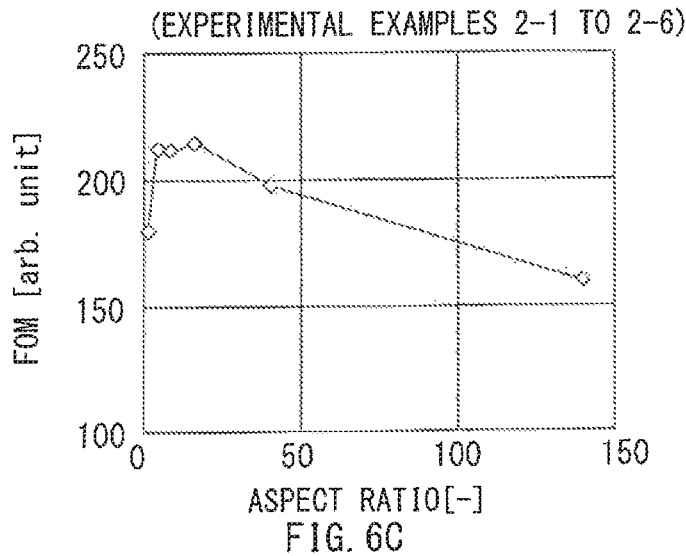
FIG. 6C is a characteristic diagram illustrating a relationship between the aspect ratio and the exponent FOM in the magnetic field detection device of Experimental Examples 2-1 to 2-6.

As illustrated in FIGS. 6A to 6C, it was found that, also in Experimental Examples 2-1 to 2-6, more favorable resolution was obtained in the case of the aspect ratio ranging from 3 to 20.

3.3 Experimental Examples 3-1 to 3-6

Next, evaluations similar to those in Experimental Examples 1-1 to 1-6 were performed under conditions similar to those in Experimental Examples 1-1 to 1-6 except the following points. That is, the widths LY1 and LY2 were both set at 100 μm; the lengths LX1 and LX2 were both set at 100 μm in Experimental Example 3-1, 300 μm in Experimental Example 3-2, 1,000 μm in Experimental Example 3-3, 2,000 μm in Experimental Example 3-4, 4,000 μm in Experimental Example 3-5, and 14,000 μm in Experimental Example 3-6; and the spacing XG was set at 50 μm. The results are illustrated in each of FIGS. 7A to 7C. It is to be noted that FIGS. 7A to 7C illustrate results that correspond, respectively, to those of FIGS. 5A to 5C.

Figure 7A:
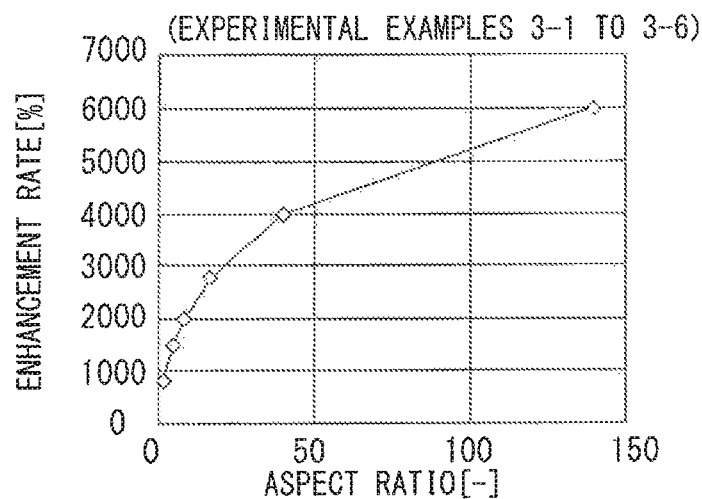
FIG. 7A is a characteristic diagram illustrating a relationship between an aspect ratio and an enhancement rate in a magnetic field detection device of Experimental Examples 3-1 to 3-6.
Figure 7B:
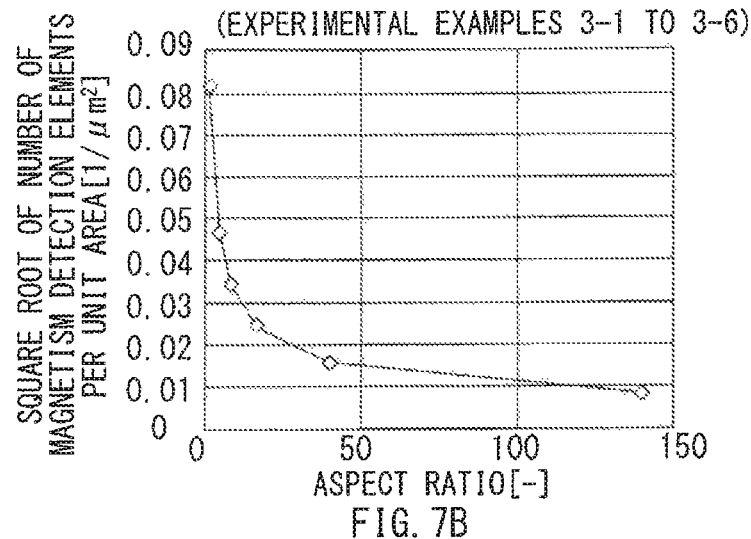
FIG. 7B is a characteristic diagram illustrating a relationship between the aspect ratio and the number of magnetism detection elements per unit area in the magnetic field detection device of Experimental Examples 3-1 to 3-6.
Figure 7C:
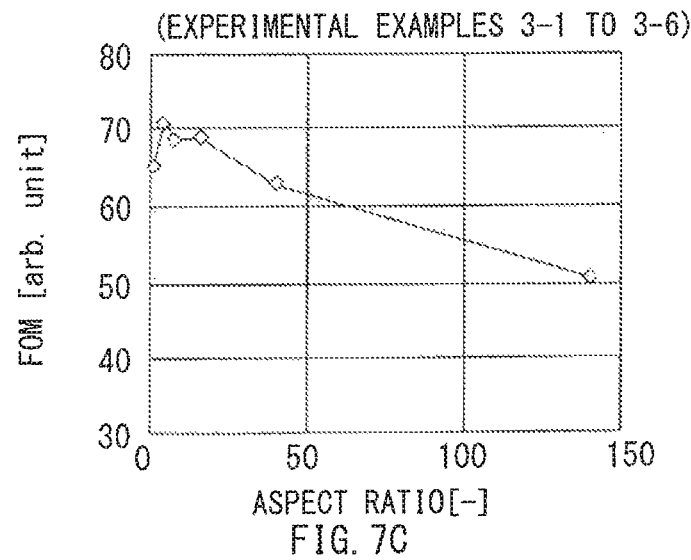
FIG. 7C is a characteristic diagram illustrating a relationship between the aspect ratio and the exponent FOM in the magnetic field detection device of Experimental Examples 3-1 to 3-6.

As illustrated in FIGS. 7A to 7C, it was found that, also in Experimental Examples 3-1 to 3-6, more favorable resolution was obtained in the case of the aspect ratio ranging from 3 to 20.

4. Modification Examples

The disclosure has been described hereinabove referring to some embodiments. However, the disclosure is not limited to such embodiments, and may be modified in various ways. For example, each diagram illustrates a case where the soft magnetic layers 11 and 12 have substantially the same size; however, the soft magnetic layers 11 and 12 may have different sizes. Further, embodiments of the disclosure is not limited to a case where the width LY3 is equal to or smaller than both of the widths LY1 and LY2 as illustrated in FIG. 1C. Embodiments of the disclosure also encompasses a case where the width LY3 is equal to or smaller than one of the widths LY1 and LY2, and a case where the width LY3 is larger than both of the widths LY1 and LY2.

Figure 8A:
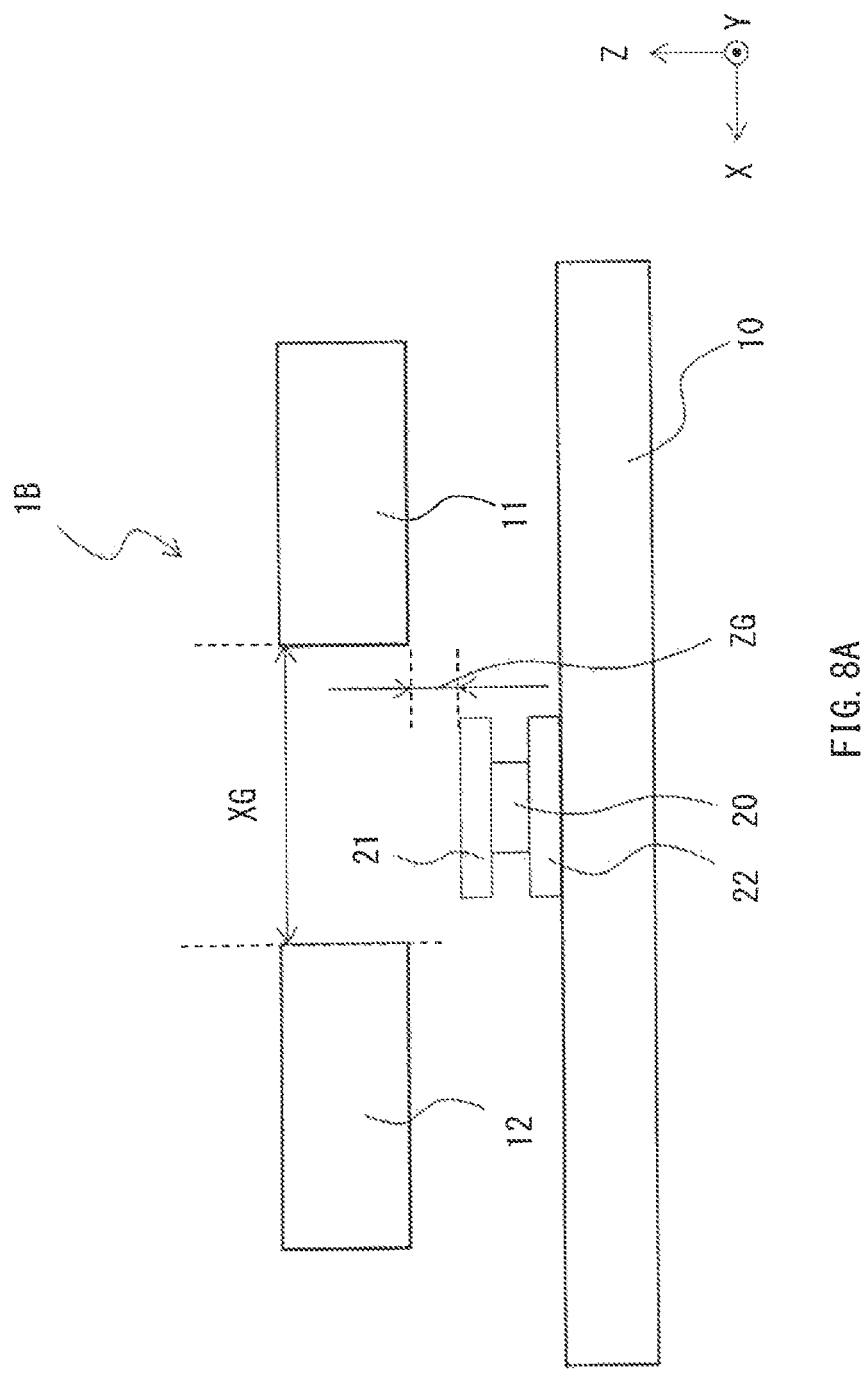
FIG. 8A is a schematic view of a magnetic field detection device according to a first modification example.
Figure 8C:
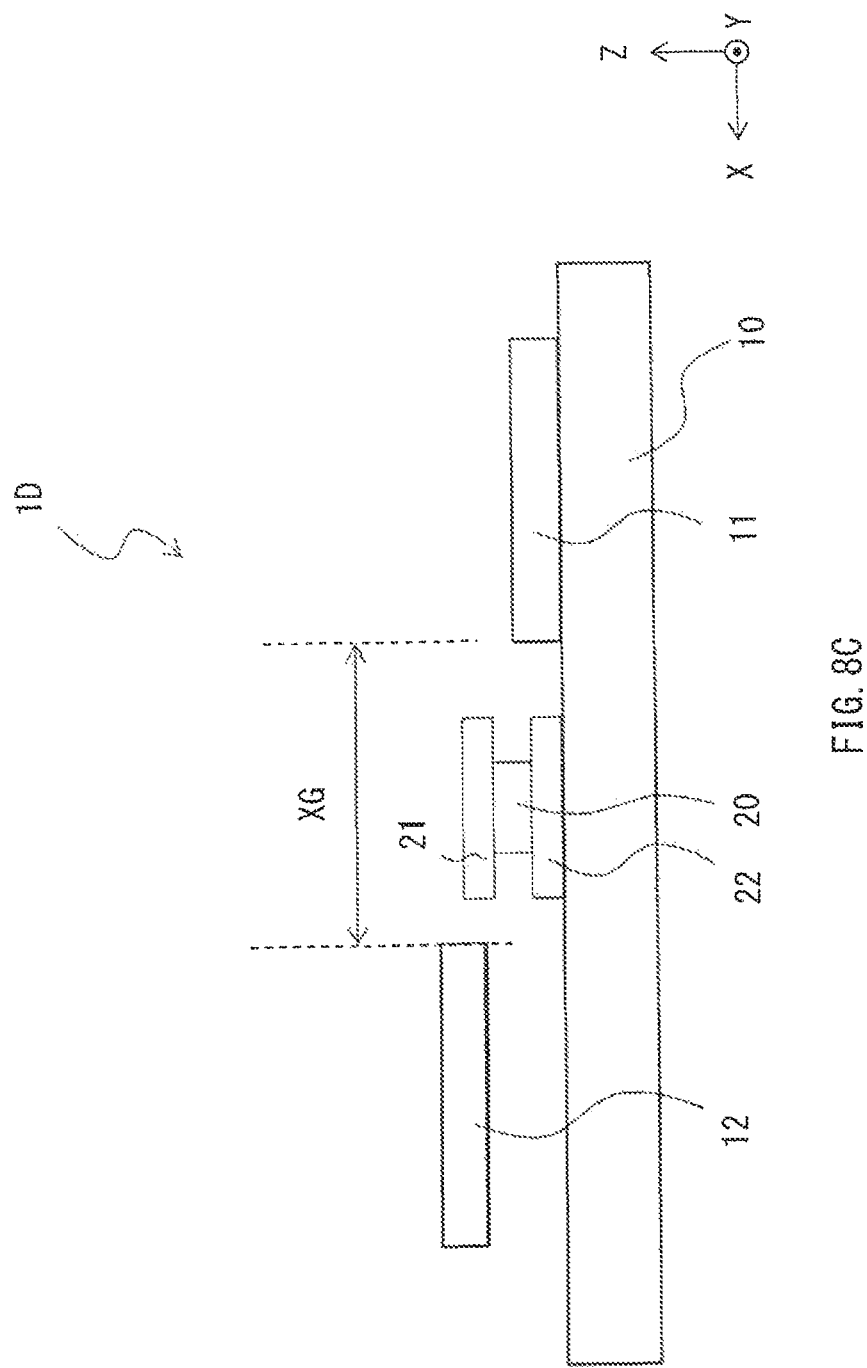
FIG. 8C is a schematic view of a magnetic field detection device according to a third modification example.

The foregoing embodiments describe a case where all of the magnetism detection element 20 and the leads 21 and 22 are present in the same level as that of the soft magnetic layers 11 and 12 as illustrated in FIG. 1B; however, the disclosure is not limited thereto. The disclosure may also include, for example, a configuration in which all of the magnetism detection element 20 and the leads 21 and 22 are present in a level different from that of the soft magnetic layers 11 and 12 as in a magnetic field detection device 1B illustrated in FIG. 8A. In the magnetic field detection device 1B, a gap ZG between the lead 21 and each of the soft magnetic layers 11 and 12 may be 10 μm, for example. Further, in the disclosure, for example, each of the leads 21 and 22 may be present in a level different from that of the soft magnetic layers 11 and 12, with only the magnetism detection element 20 being present in the same level as that of the soft magnetic layers 11 and 12, as in a magnetic field detection device 1C illustrated in FIG. 8B. Further, in embodiments of the disclosure, for example, the soft magnetic layers 11 and 12 may be present in levels different from each other as in a magnetic field detection device 1D illustrated in FIG. 8C.

Descriptions have been given, in the foregoing embodiments, by exemplifying, as the magnetism detection element, the CPP MR element having the spin-valve structure; however, the disclosure is not limited thereto. For example, a CIP (current in plane) MR element or the magnetic tunnel junction element (MTJ element) may be used as the magnetism detection element. Alternatively, a sensor may also be used, such as a magnetism detection element (e.g., Hall element) having the sensing direction as the X-axis direction, other than the MR element.

Moreover, the disclosure encompasses any possible combination of some or all of the various embodiments and the modification examples described herein and incorporated herein.

It is possible to achieve at least the following configurations from the above-described example embodiments of the disclosure.

(1) A magnetic field detection device including:

a first soft magnetic body that extends to have a first length in a first direction, and has a first width in a second direction, that is smaller than the first length, the second direction being substantially orthogonal to the first direction;

a second soft magnetic body that is disposed to be spaced apart from and face the first soft magnetic body in the first direction, and extends to have a second length in the first direction, the second soft magnetic body having a second width in the second direction, the second width being smaller than the second length; and a magnetism detection element that is disposed, in the first direction, between the first soft magnetic body and the second soft magnetic body, and extends to have a third length in the first direction and to have a third width in the second direction, the third width being larger than the third length.

(2) The magnetic field detection device according to (1), in which the third width is equal to or smaller than one or both of the first width and the second width.

(3) The magnetic field detection device according to (2), in which the third width is equal to or smaller than both of the first width and the second width.

(4) The magnetic field detection device according to (2) or (3), in which the first width and the second width are substantially same as each other.

(5) The magnetic field detection device according to any one of (1) to (4), in which a spacing between the first soft magnetic body and the second soft magnetic body is narrower than the third width.

(6) The magnetic field detection device according to any one of (1) to (5), in which a ratio of the first length to the first width ranges from 3 to 20, and a ratio of the second length to the second width ranges from 3 to 20.

(7) The magnetic field detection device according to any one of (1) to (6), in which each of the first width and the second width ranges from 10 μm to 100 μm.

(8) The magnetic field detection device according to any one of (1) to (7), in which the first length and the second length are substantially same as each other.

(9) The magnetic field detection device according to any one of (1) to (8), in which the first soft magnetic body has a first thickness in a third direction that is substantially orthogonal to both of the first direction and the second direction, the second soft magnetic body has a second thickness in the third direction, and the magnetism detection element has a third thickness in the third direction, the third thickness being equal to or smaller than one or both of the first thickness and the second thickness.

(10) The magnetic field detection device according to any one of (1) to (9), in which the magnetism detection element is disposed, in the first direction, on an extension of the first soft magnetic body, on an extension of the second soft magnetic body, or on the extensions of both of the first soft magnetic body and the second soft magnetic body.

(11) The magnetic field detection device according to any one of (1) to (10), in which a direction of a magnetic field to be detected is substantially coincident with the first direction.

(12) The magnetic field detection device according to any one of (1) to (11), in which the magnetism detection element includes a magneto-resistive effect element, the magneto-resistive effect element including:

a magnetization pinned layer having a magnetization direction substantially coincident with the first direction;

an intermediate layer; and a magnetization free layer having a magnetization easy axis substantially coincident with the second direction.

In the magnetic field detection device according to the embodiment of the disclosure, the third width may be preferably equal to or smaller than one or both of the first width and the second width. More preferably, the third width may be equal to or smaller than both of the first width and the second width. Further, the first width and the second width may be substantially same as each other. Furthermore, a spacing between the first soft magnetic body and the second soft magnetic body may be narrower than the third width.

In the magnetic field detection device according to the embodiment of the disclosure, each of the first width and the second width may range from 10 μm to 100 μm, for example. A ratio of the first length to the first width may range from 3 to 20, for example, and a ratio of the second length to the second width may range from 3 to 20, for example. The first length and the second length may be substantially same as each other.

In the magnetic field detection device according to the embodiment of the disclosure, the first soft magnetic body may have a first thickness in a third direction that is substantially orthogonal to both of the first direction and the second direction. The second soft magnetic body may have a second thickness in the third direction. The magnetism detection element may have a third thickness in the third direction. The third thickness is equal to or smaller than one or both of the first thickness and the second thickness.

In the magnetic field detection device according to the embodiment of the disclosure, the magnetism detection element may be disposed, in the first direction, on an extension of the first soft magnetic body, on an extension of the second soft magnetic body, or on the extensions of both of the first soft magnetic body and the second soft magnetic body. Further, a direction of a magnetic field to be detected may be substantially coincident with the first direction, for example In the magnetic field detection device according to one embodiment of the disclosure, the first soft magnetic body and the second soft magnetic body each having the first direction as a longitudinal direction are disposed to be spaced apart from each other. The magnetism detection element having, as a longitudinal direction, the second direction orthogonal to the first direction is disposed between the first soft magnetic body and the second soft magnetic body. Thus, the first soft magnetic body and the second soft magnetic body both behave as a magnetic yoke to enhance the external magnetic field component along the first direction, for example.

According to the magnetic field detection device as one embodiment of the disclosure, the first soft magnetic body and the second soft magnetic body each function as the magnetic yoke, thus making it possible to enhance the magnetic field to be detected. Thus, according to the magnetic field detection device as the embodiment of the disclosure, it is possible to exhibit a high magnetic field detection capability.

Although the disclosure has been described in terms of exemplary embodiments, it is not limited thereto. It should be appreciated that variations may be made in the described embodiments by persons skilled in the art without departing from the scope of the disclosure as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably", "preferred" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A magnetic field detection device comprising:
a first soft magnetic body including a first region that extends to have a first length in a first direction, and has a first width in a second direction, the first width being smaller than the first length, the second direction being substantially orthogonal to the first direction;
a second soft magnetic body including a second region that is disposed to be spaced apart from and face the first soft magnetic body in the first direction, and extends to have a second length in the first direction, the second soft magnetic body having a second width in the second direction, the second width being smaller than the second length; and
a magnetism detection element that is disposed, in the first direction, between the first soft magnetic body and the second soft magnetic body, and extends to have a third length in the first direction and to have a third width in the second direction, the third length being smaller than both of the first length and the second length, the third width being larger than the third length and being equal to or smaller than both of the first width and the second width.

2. The magnetic field detection device according to claim 1, wherein the third width is equal to or smaller than one or both of the first width and the second width.

3. The magnetic field detection device according to claim 2, wherein the third width is equal to or smaller than both of the first width and the second width.

4. The magnetic field detection device according to claim 2, wherein the first width and the second width are substantially same as each other.

5. The magnetic field detection device according to claim 1, wherein a spacing between the first soft magnetic body and the second soft magnetic body is narrower than the third width.

6. The magnetic field detection device according to claim 1, wherein
a ratio of the first length to the first width ranges from 3 to 20, and
a ratio of the second length to the second width ranges from 3 to 20.

7. The magnetic field detection device according to claim 1, wherein each of the first width and the second width ranges from 10 μm to 100 μm.

8. The magnetic field detection device according to claim 1, wherein the first length and the second length are substantially same as each other.

9. The magnetic field detection device according to claim 1, wherein
the first soft magnetic body has a first thickness in a third direction that is substantially orthogonal to both of the first direction and the second direction,
the second soft magnetic body has a second thickness in the third direction, and
the magnetism detection element has a third thickness in the third direction, the third thickness being equal to or smaller than one or both of the first thickness and the second thickness.

10. The magnetic field detection device according to claim 1, wherein the magnetism detection element is disposed, in the first direction, on an extension of the first soft magnetic body, on an extension of the second soft magnetic body, or on the extensions of both of the first soft magnetic body and the second soft magnetic body.

11. The magnetic field detection device according to claim 1, wherein a direction of a magnetic field to be detected is substantially coincident with the first direction.

12. The magnetic field detection device according to claim 1, wherein the magnetism detection element comprises a magneto-resistive effect element, the magneto-resistive effect element including:
a magnetization pinned layer having a magnetization direction substantially coincident with the first direction;
an intermediate layer; and
a magnetization free layer having a magnetization easy axis substantially coincident with the second direction.

13. A magnetic field detection device comprising:
a first soft magnetic body magnetic collection region that extends to have a first length in a first direction, and has a first width in a second direction, the first width being smaller than the first length, the second direction being substantially orthogonal to the first direction;
a second soft magnetic body magnetic collection region that is disposed to be spaced apart from and face the first soft magnetic body magnetic collection region in the first direction, and extends to have a second length in the first direction, the second soft magnetic body magnetic collection region having a second width in the second direction, the second width being smaller than the second length; and
a magnetism detection element that is disposed, in the first direction, between the first soft magnetic body magnetic collection region and the second soft magnetic body magnetic collection region, and extends to have a third length in the first direction and to have a third width in the second direction, the third width being larger than the third length.

14. A magnetic field detection device comprising:
a first soft magnetic body magnetic collection region that extends to have a first length in a first direction, and has a first width in a second direction, the first width being smaller than the first length, the second direction being substantially orthogonal to the first direction;
a second soft magnetic body magnetic collection region that is disposed to be spaced apart from and face the first soft magnetic body magnetic collection region in the first direction, and extends to have a second length in the first direction, the second soft magnetic body magnetic collection region having a second width in the second direction, the second width being smaller than the second length; and
a magnetism detection element that is disposed in a magnetically affected area where both the first soft magnetic body magnetic collection region and the second soft magnetic body magnetic collection region are magnetically affected, and extends to have a third length in the first direction and to have a third width in the second direction, the third length being smaller than both of the first length and the second length, the third width being larger than the third length and being equal to or smaller than both of the first width and the second width.

* * * * *